United States Patent [19]
Greene

[11] 3,855,581
[45] Dec. 17, 1974

[54] SEMICONDUCTOR DEVICE AND CIRCUITS

[75] Inventor: Richard M. Greene, Audubon, Pa.

[73] Assignee: MOS Technology, Inc., Valley Forge, Pa.

[22] Filed: Dec. 26, 1972

[21] Appl. No.: 318,456

Related U.S. Application Data

[62] Division of Ser. No. 213,945, Dec. 30, 1971, abandoned.

[52] U.S. Cl. ... 340/173 R, 317/235 R, 340/173 CA
[51] Int. Cl. .......... G11c 11/40
[58] Field of Search .......... 340/173 CA, 173 R; 317/235 R

[56] References Cited

UNITED STATES PATENTS 3,549,911 12/1970 Scott .......... 340/173 CA

*Primary Examiner*—Terrell W. Fears
*Attorney, Agent, or Firm*—Cooper, Dunham, Clark, Griffin & Moran

[57] ABSTRACT

A solid state switch comprising a semiconductive wafer including a substrate of one conductivity type and a surface channel of opposite conductivity type defined along a major surface of the substrate, a first terminal defining a low resistance contact to the surface channel, an insulated electrode, including a dielectric layer and an outer electrode covering, overlying a portion of said major surface of the substrate, a second terminal defining a low resistance contact to said outer electrode covering, the outer electrode when connected through said second terminal to a predetermined threshold voltage source causing an inversion layer at adjacent portions of the major surface, the insulated electrode and surface channel having overlapping areas characterized in that substantially zero capacitance is defined between the first and second terminals when the second terminal is maintained below the threshold voltage, and a data or control signal coupling capacitance is defined between the first and second terminals when the second terminal is at or above the threshold voltage.

A memory circuit embodying this solid state switch is also disclosed and includes a data translating circuit having input and output circuits, means for connecting the second terminal of the solid state switch to the input circuit of the data translating circuit, memory means connected to the second terminal of the solid state switch, data input means also connected to the second terminal for supplying data signals for storage in said memory means, some of the data signals being stored at a voltage equal to or greater than the threshold voltage whereby an inversion layer is defined adjacent the major surface of the substrate, readout pulse source means, and means for connecting the first terminal of the solid state switch to the readout pulse source means whereby data is read out at the output of the data translating circuit.

12 Claims, 13 Drawing Figures

SEMICONDUCTOR DEVICE AND CIRCUITS

This is a division, of application Ser. No. 213,945, filed Dec. 30, 1971, now abandoned.

BACKGROUND OF THE INVENTION

This invention relates to a solid state switch and associated circuitry, and more particularly to a solid state switch and associated circuitry especially adapted for metal-oxide-semiconductor (MOS) integrated circuit structures.

Because of the relative ease of fabricating a MOS device, its inherent on/off characteristic, and its small size and low power dissipation, electronic manufacturers rely more and more on MOS arrays in constructing electronic systems, especially digital systems. Small lightweight computers relying heavily on MOS digital integrated circuits have been developed. Complex integrated monolithic MOS arrays, such as shift registers, multiplexers, random access memories, up-down counters, to name a few, are now extensively employed by the computer industry. These MOS digital arrays are in reality a complex integration of MOS field-effect transistors arranged in a few basic "building blocks," such as for example inverters, flip-flops, AND-gates and OR-gates.

SUMMARY OF THE INVENTION

In accordance with the present invention there is provided a novel semiconductor element which can be used together with one or more MOS field-effect transistors to form new "building blocks" for use in making complex MOS arrays and which can be formed on the same substrate adjacent the MOS field-effect transistors without the need of additional processing steps.

The novel semiconductor element is essentially a two terminal solid state capacitive switch comprised of a semiconductive wafer having a substrate of one conductive type, a surface channel of opposite conductivity defined along a major surface of the substrate, and an insulated electrode overlying a portion of the major surface of the substrate. The insulated electrode includes a layer of dielectric material, such as silicon dioxide, which directly overlies a portion of the major surface of the substrate, and a metalization cover. When the insulated electrode is maintained at or above a predetermined threshold voltage, relative to the surface channel, an inversion layer is formed at the interface between the layer of dielectric material and the underlying substrate. A first terminal is provided defining a low resistance contact to the surface channel, and a second terminal is provided defining a low resistance contact to the metalization cover of the insulated electrode. The insulated electrode and the surface channel of the semiconductive wafer have finite but minimum overlapping areas characterized in that when the second terminal is maintained relative to the surface channel at a voltage below the threshold voltage necessary to cause the formation of an inversion layer, substantially zero capacitance is defined between the first terminal connected to the surface channel and the second terminal connected to the metalization cover. However, when the second terminal is maintained relative to surface channel at a value equal to or greater than the threshold voltage, an inversion layer is formed below the insulated electrode and the surface channel is effectively extended under the insulated electrode, thereby in effect increasing the overlap between the surface channel and the insulated electrode and thus also substantially increasing the coupling capacity between the first terminal and the second terminal.

Accordingly, the solid state switch of the present invention is controlled in accordance with the value of the voltage at the second terminal connected to the insulated electrode. When this voltage is maintained relative to the surface channel, at a value below the threshold voltage, there is substantially no capacitive coupling between the first and second terminals, but when this voltage is at or above the threshold voltage, capacitive coupling is formed between the first and second terminals and data or control signals may be coupled between these two terminals.

The two terminal, voltage controlled solid state switch, because it is constructed of materials common to MOS field-effect transistors, can be made simultaneously with the fabrication of associated MOS field-effect transistors and without any modification of the MOS fabricating process. Specifically, the substrate of the solid state switch can be as thick and of the same material as the substrate used in a MOS field-effect transistor. Similarly, the surface channel of the solid state switch can be of the same material and depth of diffusion as the channel materials of a MOS field-effect transistor, and the insulated electrode may comprise an oxide layer, such as silicon dioxide, having the same thickness as the insulated gate of a MOS field-effect transistor.

The two terminal solid state switch of the present invention can be used together with one or more MOS field-effect transistors to define novel memory circuits usable as "building blocks" in making complex MOS digital arrays. Specifically, these novel memory circuits include a data translating circuit having an input and output circuit, such as for example, an MOS field-effect transistor connected in source follower configuration, circuit means connecting the second terminal of the voltage controlled solid state switch to the input circuit of the data translating circuit and connecting memory means between this second terminal and a point of reference in the circuit, data input means for supplying data signals, such as "0" and "1" data bits, for storage in the memory means, one of these bits being stored at a voltage level corresponding to at least the threshold voltage necessary to cause an inversion layer in the solid state switch, a readout pulse source and circuit means for connecting the first terminal of the solid state switch to the readout pulse source means.

The data signals are selectively stored in the memory means, such as by switch circuitry operated by a write pulse. This stored data is read out from the memory means to the output circuit of the data translating circuit by the application of a readout pulse to the first terminal of the solid state switch. When the data stored in the memory means is at a voltage logic level causing the formation of an inversion layer in the solid state switch, a coupling capacity is formed between the first and second terminals of the solid state switch, allowing a readout pulse to pass to the output circuit of data translating circuit. When the data stored in the memory means is at a voltage logic level below the threshold voltage, no inversion layer is formed in the solid state switch, and because of the minimum overlap between the surface channel and insulated electrode, substantially zero capacitance is defined between the first and second terminals of the solid state switch, preventing passage of the readout pulse to the output circuit of the data translating circuit. By establishing the ratio of capacitance of the solid state switch and the node capacitance at the second terminal of the solid state switch as described hereinafter, it is possible to read out stored data signals at an amplified logic level as compared to the actual stored logic level. For example, ideally by establishing the readout pulse at 20 volts, data stored in the memory means at a relatively small value, for example 7 volts, can be read out at the output circuit of the data translating circuit at value corresponding to substantially 20 volts.

Moreover, by providing additional components, such as MOS switches and additional write pulse sources, it is possible to utilize the memory circuit of the present invention to define a digital read/write memory circuit, a digital regenerative amplifier, a digital isolation amplifier and the like.

Various other objects, features and advantages of the invention will be apparent from the detailed description of the preferred embodiments thereof set forth hereinafter and shown in the accompanying drawings.

DESCRIPTION OF THE PREFERRED EMBODIMENTS

Figure 1:
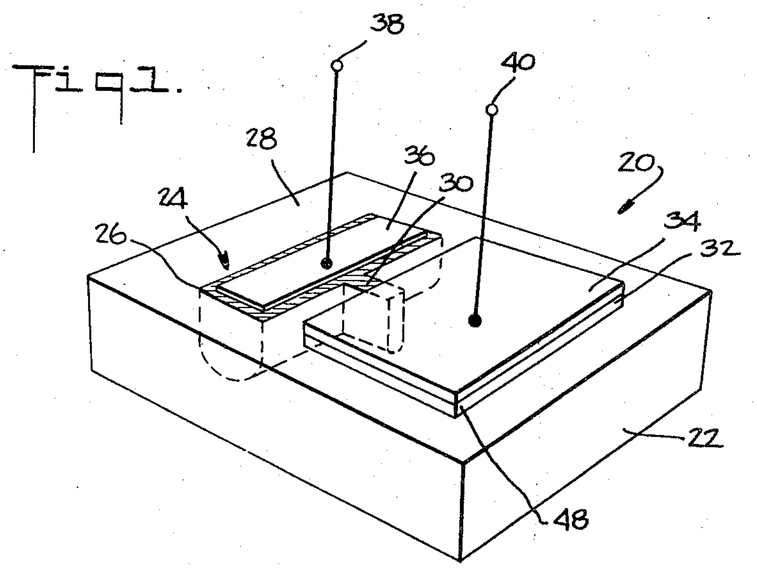
FIG. 1 is a perspective view showing a two terminal solid state switch constructed in accordance with the present invention.
Figure 2:
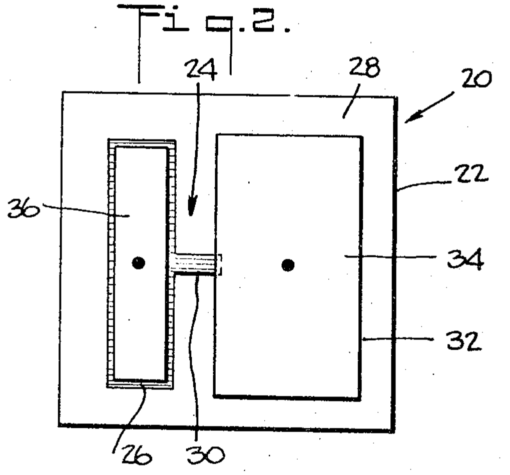
FIG. 2 is a plan view of the solid state switch of FIG. 1.
Figure 3:
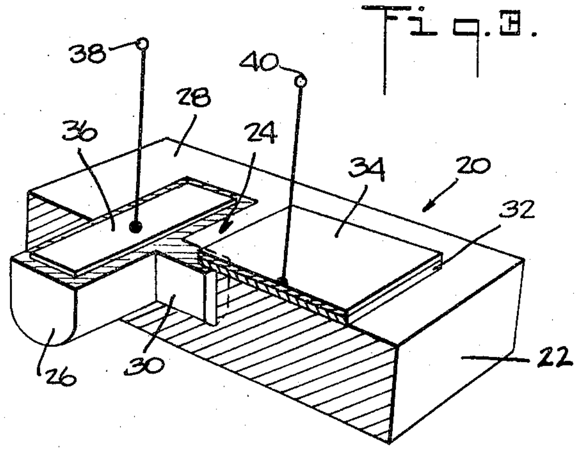
FIG. 3 is another perspective view, partially in cross section, of the solid state switch shown in FIG. 1.

Referring to the drawings in more detail, wherein like reference numerals used throughout the various Figs. refer to like structure and function, and more specifically referring to FIGS. 1, 2 and 3, there is depicted a two terminal solid state switch 20 in the form of a semiconductive wafer including a substrate portion 22 of one conductivity type, such as a relatively high resistivity n-type semiconductive material, and a surface channel 24 of opposite conductivity type, such as a relatively low resistivity p-type semiconductive material. The surface channel 24 includes a main body portion 26 extending laterally across a major surface 28 of the substrate 22, and a finger portion 30 extending for a short distance perpendicularly of the main body portion 26. A layer 32 of dielectric material, such as silicon-dioxide, overlies a portion of the major surface 28 of the substrate 22 and a portion of the area of the finger portion 30 of the surface channel. A metalization cover 34 completely overlies the layer 32 of dielectric material and together with this layer defines an insulated electrode on the major surface 28 of the substrate 22. The layer 32 of dielectric material is made extremely thin so that, when the metalization cover 34 is connected to a source of voltage having an amplitude above a predetermined threshold relative to the voltage applied to surface channel 24, a high electric field is established across the layer 32 and an inversion layer is formed at the adjacent surface of the substrate 22 just below this layer. A metalization cover 36 is provided over the surface of the main body portion 26 of the surface channel 24 and a low resistance contact is electrically connected to the metalization cover 36 and defines a first terminal 38 of the solid state switch 20. A second low resistance contact, electrically connected to the metalization cover 34 of the insulated electrode, defines a second terminal 40 of the solid state switch.

As best shown in FIGS. 2 and 3, the overlapping areas of the surface channel 24 and the layer 32 of dielectric material are made finite but as small or minimum as processing procedures permit, so that substantially zero interelectrode capacitance is defined between the terminals 38 and 40 when no inversion layer is formed in the solid state switch 20. To this end, the finger portion 30 of the surface channel 24 is made of minimum width and of longitudinal extent sufficient to allow finite but minimum overlap of the finger portion 30 and the layer 32 of dielectric material, while the main body portion 26 of the surface channel 24 is substantially wider and is spaced apart from the layer 32 of dielectric material in non-overlapping relationship.

The solid state switch 20 can be fabricated with the same materials and processes used in making metal-oxide-semiconductors, such as MOS field-effect transistors. Thus, the substrate 22 of the solid state switch 20 can be as thick and of the same material as any of the substrates used in making known MOS field-effect transistors; the surface channel 24 can be of the same material and depth of diffusion as the surface channels of known MOS field-effect transistors; and the layer 32 of dielectric material can be of the same material, thickness and areas as the dielectric insulating layer employed in the insulated gate of known MOS field-effect transistors. Accordingly, the processing of the solid state switch 20 is compatable with and can be made simultaneously during the fabrication of MOS field-effect transistors without modification of the MOS processing procedures.

Figure 4:
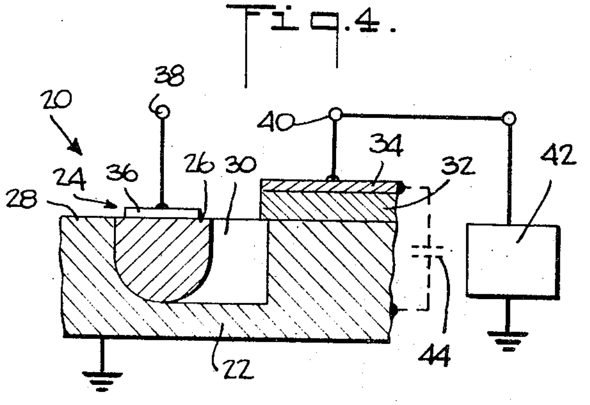
FIG. 4 is a cross sectional view of the solid state switch of FIG. 1 showing in diagramatic form its electrical characteristics when at one logic level.

The solid state switch 20 can be operated as a voltage controlled switch having the capacitive coupling between the terminals 38 and 40 determined by the value or logic level of the voltage at the terminal 40. As diagramatically illustrated in FIG. 4, when the terminal 40 is connected to a voltage source 42 having a value relative to the surface channel 24 below the threshold voltage necessary to form an inversion layer in the solid state switch 20, an open circuit is defined between the two terminals 38 and 40 of the switch, and control or data signals cannot be coupled between these terminals. The open circuit is defined between terminals 38 and 40 because the terminal 38 is completely electrically insulated from terminal 40 by the layer 32 of dielectric material and, as described above, the solid state switch 20 is fabricated to completely eliminate as far as possible coupling capacitance between these terminals. In this open state, the solid state switch 20 has a cpacitance, shown in FIG. 4 as a capacitor 44, between the terminal 40 and the substrate 22 or ground, and very little capacitance between the terminal 38 and terminal 40.

The value of the capacitance (capacitor 44), between the terminal 40 and the substrate 22 or ground in this logic state is dependent on the value of the voltage between terminal 40 and the substrate or ground. If this voltage is relatively low, so that substantially no depletion layer is formed beneath the layer 32 of dielectric material, the value of this capacitance is approximately equal to the capacity $C_{ox}$ defined by the dielectric layer. However, if the voltage between terminal 40 and the substrate or ground is below the threshold value at which an inversion layer is formed in the solid state switch 20, but high enough to cause the formation of a depletion layer in the solid state switch, the value of the capacitance (capacitor 44) between the terminal 40 and substrate or ground is approximately equal to the sum of the series combination of the capacity $C_{ox}$ defined by the dielectric layer and the capacity $C_{dp}$ defined by the depletion layer.

Figure 5:
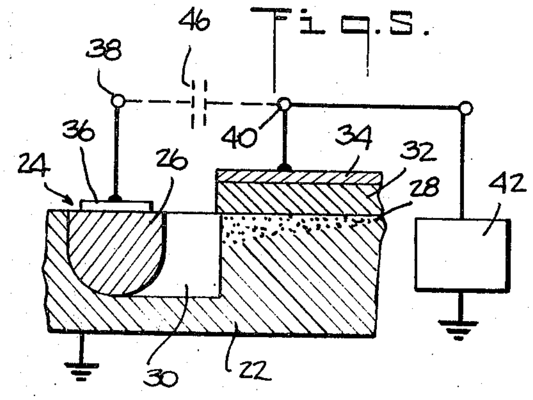
FIG. 5 is a cross sectional view of the solid state switch of FIG. 1 showing in diagramatic form its electrical characteristics when at the other logic level.

On the other hand, as diagramatically illustrated in FIG. 5, when the voltage source 42 is at a voltage level such that the voltage between terminals 40 and 38 is equal to or greater than the threshold voltage, an inversion layer is formed in the solid state switch and acts to effectively extend the surface channel 24 beneath the layer 32 of dielectric material and substantially increase the overlap or coupling capacitance between the terminals 40 and 38. Accordingly, in this second state, the solid state switch 20 has substantial interelectrode capacitance, shown in FIG. 5 as a coupling capacitor 46, defined between the terminals 38 and 40, and control or data signals can be coupled between these terminals.

Figure 6:
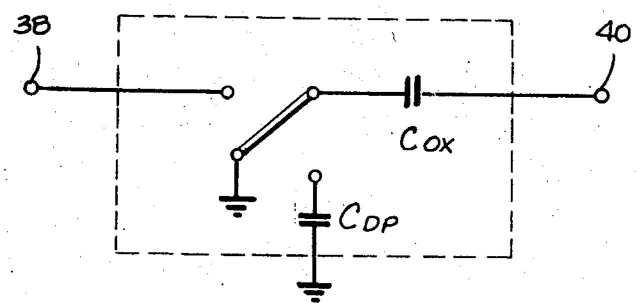
FIG. 6 is a schematic circuit diagram illustrating the equivalent circuit of the solid state switch of FIG. 1.

It has been found that the capacitance (capacitor 46) between the terminals 38 and 40 is for all practical purposes equal to the capacity $C_{ox}$ defined between terminal 40 and the substrate and, accordingly, the voltage controlled solid state switch 20 may be considered to have the electrical characteristics of the lectric circuit shown schematically in FIG. 6. Thus, assuming that the capacitance value of the capacitor 46 (FIG. 5) is equal to the capacitance $C_{ox}$ (i.e., the capacitance between terminal 40 and the substrate when the voltage at terminal 40 is below that which causes either an inversion or a depletion layer), the solid state switch 20 can be considered a three state device. In one state, the solid state switch 20 provides an open circuit to control or data signals between the terminals 38 and 40, while applying a capacitance equal to $C_{ox}$ between the terminal 40 and a point of reference in the circuit, such as ground. In a second state, the solid state switch 20 provides an open circuit to control or data signals between the terminals 38 and 40 while applying a capacitance equal to the series combination of $C_{ox}$ and $C_{dp}$ between the terminal 40 and ground. In its third state, the solid state switch 20 provides control or data signal coupling through the capacitor equal to $C_{ox}$ between the terminals 38 and 40. As described herinafter, by establishing a certain ratio between the capacitance of the solid state switch 20 and the nodal capacitance at terminal 40, the solid state switch 20 can be utilized as a two state switch operated by data signals at one of two voltage logic levels.

Figures 7, 8:
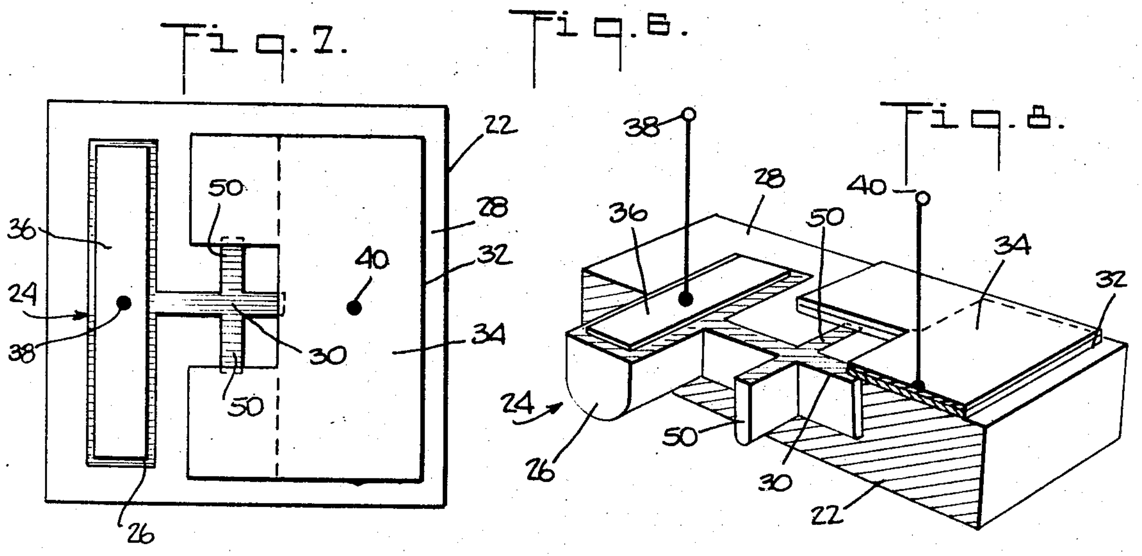
FIGS. 7 and 8 are plan and perspective views of another solid state switch constructed in accordance with the present invention.

It has been found that the capacitance value of the capacitor $C_{ox}$ (FIG. 6) of the solid state switch 20 is, as a first approximation, a function of the extent of the lateral area of the layer 32 of dielectric material, such as corner 48 in FIG. 1. Accordingly, if desired, different capacitance values of the capacitor $C_{ox}$ may be obtained by varying the geometric extent of layer 32. For applications requiring a large value of capacitance, the solid state switch construction shown in FIGS. 7 and 8 has been found desirable. As shown in FIGS. 7 and 8, the finger portion 30 of the surface channel 24 is provided with two side projections 50 which extend perpendicularly to the longitudinal sides of the finger portion 30. In this construction, the layer 32 of dielectric material and the metalization layer 34 are formed in the somewhat U shape shown in FIGS. 7 and 8, so that they overlap finite but minimum areas of the side projections 50 as well as the extreme tip of the finger portion 30.

Also, if desired, the dielectric layer 32 and metalization cover 34 may be divided into two or three separate sections, such as along the dashed lines shown in FIGS. 7 and 8, with the separate sections being spaced apart electrically and a separate conductor and terminal attached to each. The capacitive coupling between terminal 38 and the terminals of the different metalization sections would then depend upon whether or not the threshold voltage is applied to the respective terminals. Thus, by selectively applying the threshold voltage to one or more of terminals of the metalization sections, but not to all of them, the selected terminals would be coupled to terminal 38, while the remaining terminals would not. This selective coupling from terminal 38 to any one of several insulated electrodes can, of course, be achieved by the use of other device configurations. For example, the device shown in FIGS. 1 to 3 could be formed with multiple parallel fingers 30, each extending underneath a different insulated electrode. In such an arrangement a data or control pulse applied to the terminal 38 can selectively be channelled to one or more of the terminals of the separate insulated electrodes by controlling whether or not a threshold voltage is applied to such terminals.

It should also be understood that while the switch 20 of the present invention has been described as a p-channel device, having an n-type base of relatively high resistivity and a p-type channel of relatively low resistivity, it could also be made as an n-channel device with a p-type base and n-type channel. This would, however, require a reversal of the polarity of the voltages applied to the switch terminals 38 and 40.

The two terminal solid state switch 20 may be used with other MOS devices, such as MOS field-effect transistors, to define novel memory circuits capable of storing, isolating and regenerating data in the form of binary bits. Illustrative memory circuits are shown in FIGS. 9 through 13, where, in each, the solid state switch 20 is schematically shown by the symbol including a rectangular box 54 and a spaced apart electrode 56. The spaced apart electrode 56 is representative of the function and properties of the insulated electrode including the layer 32 of dielectric material and the metalization cover 34 electrically connected to the terminal 40 of the switch 20, and the rectangular box 54 is representative of the other parts of the solid state switch including the surface channel 24 and metalization cover 36 connected to the terminal 38 of the switch 20.

Figure 9:
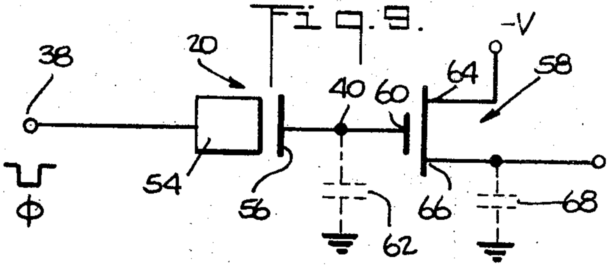
FIG. 9 is a schematic circuit diagram of a basic memory circuit of the present invention embodying the solid state switch of FIG. 1.

In the circuit shown in FIG. 9, the solid state switch 20 cooperates with a MOS field-effect transistor 58 to define a memory circuit capable of storing data bits and reading out the stored data bits in amplified form. Specifically, the terminal 38 of the solid state switch is connected to a source (not shown) of readout pulses $\phi$, while the other terminal 40 of the switch is directly connected to the gate electrode 60 of the MOS field-effect transistor 58. The gate electrode 60 of the MOS field-effect transistor is also coupled to circuit ground through the nodal capacitance (shown in FIG. 9 as capacitor 62) between the gate electrode 60 and ground which is the sum of all capacitance on terminal 40 exclusive of the solid state switch capacitance described above. The MOS field-effect transistor 58 is connected in source follower configuration, such that its drain electrode 64 is connected to a voltage source V, and its source electrode 66 is coupled to circuit ground through the nodal capacitance (shown in FIG. 9 as capacitor 68) between that electrode and circuit ground.

In the operation of the memory circuit shown in FIG. 9, data in the form of "1" and "0" binary bits, is coupled to the capacitor 62 from a data source (not shown) connected to the gate 60 of the MOS field-effect transistor 58, and is read out by the application of a readout pulse $\phi$ to the first terminal 38 of the solid state switch 20. The binary "1" bit, when stored in the capacitor 62, is assigned (arbitrarily) a logic voltage level greater than the threshold voltage which causes inversion in the solid state switch 20, and the binary "0" bit is assigned (arbitrarily) a logic voltage level less than the threshold voltage. If a "0" bit is stored in the capacitor 62, because the logic voltage level of this bit is less than the threshold voltage with respect to the voltage on terminal 38, no inversion occurs in the solid state switch 20 and an open circuit is provided between the terminals 38 and 40. Accordingly, the readout pulse $\phi$ applied to the terminal 38 is substantially decoupled from the solid state switch 20 and the MOS field-effect transistor 58. Thus, when a "0" bit is read out, the output at the source electrode 66 of the MOS field-effect transistor 58 is essentially zero. If a "1" bit is stored in the capacitor 62, because the logic voltage level of such bit is above the threshold voltage with respect to terminal 38, an inversion layer is formed in the solid state switch 20 and capacitive coupling is provided between the terminals 38 and 40 of the solid state switch 20. Accordingly, when a readout pulse $\phi$ is applied to the terminal 38, it is coupled through the solid state switch 20 and the MOS field-effect transistor 58 to the source electrode 66. Thus, when a "1" bit is read out, since the gain of the MOS field-effect transistor 58, connected in the source follower configuration of FIG. 9, is essentially one or unity for all input voltages greater than its threshold, the value of the output pulses at the source electrode 66 will correspond to the amplitude of the "1" bit less the threshold voltage plus a portion of the readout pulse $\phi$ applied to terminal 38 of the solid state switch 20. By establishing a very large ratio of the capacitance of the solid state switch 20 to the node capacitance at terminal 40 it is possible to read stored data at an amplified logic level as compared to the actual stored logic level. For example, using a p-channel switch 20, if a "1" bit is stored in the capacitor 62 at a logic level of −7 volts and a "0" bit stored at a logic level of zero volts, with the terminal 38 also at zero volts, switch 20 will be above threshold and in a coupling mode for the "1" bit, but below threshold and in a non-coupling mode for the "0" bit. If a readout pulse $\phi$ of −20 volts is applied to terminal 38 of the solid state switch 20, it is possible to read out stored "1" bits on electrode 66 at an amplified logic level of approximately 20 volts while still reading out stored "0" bits at zero volts.

Figure 10:
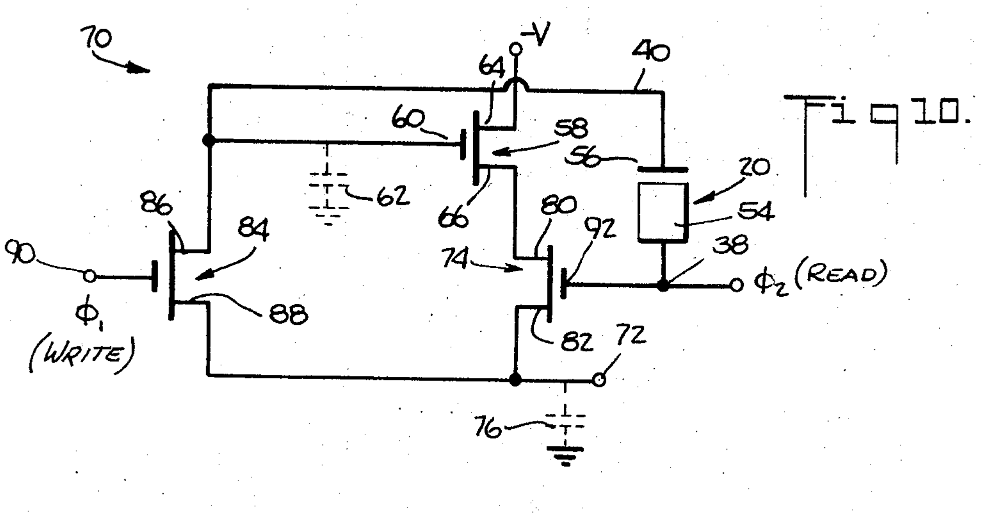
FIG. 10 is a schematic circuit diagram of a digital read-write memory circuit embodying the solid state switch of FIG. 1.

The above described memory circuit can be extended to provide the read/write memory circuit 70 shown in FIG. 10. As shown in FIG. 10, the source electrode 66 of the MOS field-effect transistor 58 is connected to a data node 72 through a first switch defined by a MOS field-effect transistor 74. In this circuit, data bits to be stored are provided at the data node 72, and data stored in the memory circuit is read out and returned to the same common data node 72. The data node 72 is coupled to circuit ground through inherent capacitance (shown in FIG. 10 as capacitor 76) defined between the data node 72 and ground. In this extended memory circuit, the source electrode 66 of the MOS field-effect transistor 58 is connected to the drain electrode 80 of the MOS field-effect transistor 74, and the source electrode 82 of the MOS field-effect transistor 74 is in turn connected to data node 72. The data node 72 is also coupled to the storage capacitor 62 through a second switch defined by a MOS field-effect transistor 84. The source electrode 86 of the MOS field-effect transistor 84 is connected directly to the storage capacitor 62, and the drain electrode 88 thereof is connected directly to the data node 72. The gate electrode 90 of the MOS field-effect transistor 84 is connected to a source (not shown) of write pulses $\phi_1$ whereby the MOS field-effect transistor 84 is turned on during the presence of these pulses. Similarly, the gate electrode 92 of the MOS field-effect transistor 74 is connected to the terminal 38 of the solid state switch 20 and to the source of readout pulses $\phi_2$ (not shown).

In the operation of the read/write memory circuit 70 shown in FIG. 10, a data bit is stored in the memory capacitor 62 by simultaneously applying the data bit to the data node 72 and applying a write pulse $\phi_1$ to the gate electrode 90 of the MOS field-effect transistor 84, thereby providing a closed circuit directly between the data node 72 and the memory capacitor 62. The control pulses $\phi_1$ and $\phi_2$ do not overlap in time during the storing of a data bit, so that the MOS field-effect transistor 74 is not energized during storage of the data bit and accordingly the stored data bit can be coupled back through the MOS field-effect transistor 74 to the data node 72. Stored data is read out of the memory capacitor 62 by the application of a readout pulse $\phi_2$ to both the gate electrode 92 of the MOS field-effect transistor 74 and the terminal 38 of the solid state capacitor switch 20. The application of the readout pulse $\phi_2$ to the gate 92 turns on the field-effect transistor 74 and couples the source electrode 66 of the MOS field-effect transistor 58 to the data node 72. If the data stored in the memory capacitor 62 is a "0" bit, no inversion occurs in the solid state switch 20 and the resultant open circuit between terminals 38 and 40 of the solid state switch 20 prevents the passage of the readout pulse $\phi_2$ through the MOS field-effect transistor 58 to the data node 72, whereby the output of the memory circuit 70 is zero. If the data stored in memory capacitor 62 is a "1" bit, inversion occurs in the solid state switch 20 and a coupling capacitance is formed between the terminals 38 and 40 which permits the passage of the readout pulse $\phi_2$ through both the solid state switch 20 and the MOS field-effect transistor 58 to the data node 72, whereby the output of the memory circuit 70 could be at a level corresponding to the level of the readout pulse $\phi_2$. Of course, if the control pulses $\phi_1$ and $\phi_2$ overlap in time, and no input data bit is simultaneously applied to data node 72, it is possible to simultaneously read out the stored data to data node 72 and return the stored data back through the MOS field-effect transistor 84 for restorage in the capacitor 62.

Figure 11:
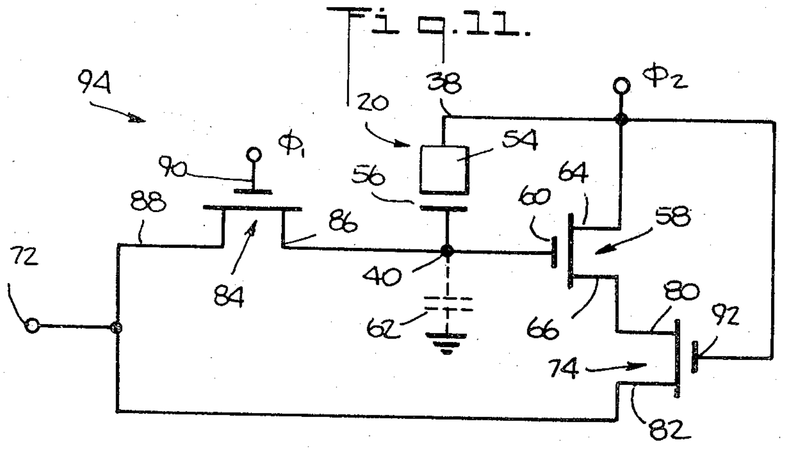
FIG. 11 is a schematic circuit diagram of a digital regenerative amplifier embodying the solid state switch of FIG. 1.
Figure 12:
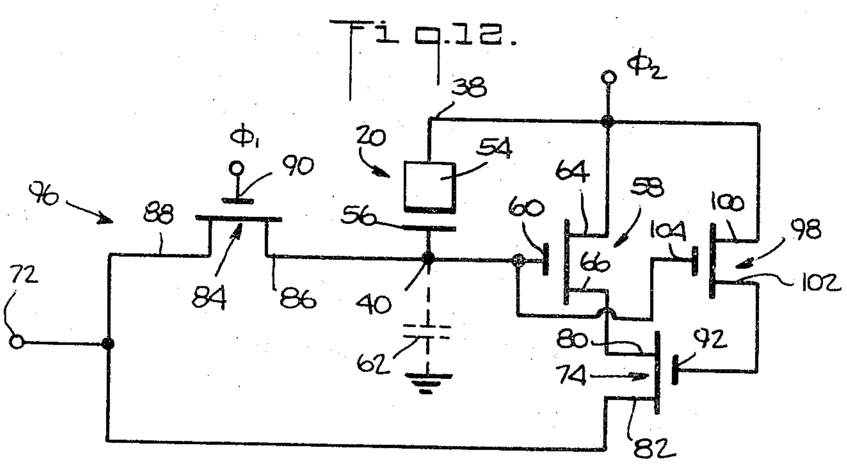
FIG. 12 is a schematic circuit diagram of another digital regenerative amplifier embodying the solid state switch of FIG. 1.

The read/write memory circuit shown in FIG. 10 can be modified to provide the digital regenerative amplifier 94 shown in FIG. 11. The solid state switch 20, the field-effect transistor 58 and the field-effect transistor 74 are inter-connected together in the same manner as described in connection with the memory circuit 70 shown in FIG. 10, except that the drain electrode 64 of the MOS field-effect transistor 58 is connected to the source of readout pulses $\phi_2$ rather than to the voltage power source V. By establishing the timing relation of the write pulse $\phi_1$ and readout pulse $\phi_2$ to follow one another, a data bit applied to the data node 72 can be stored in the memory capacitor 62 and immediately thereafter, read out and feed back to the data node 72 in amplified form.

In some instances, the regenerative amplifier 94 shown in FIG. 11, because of capacitive coupling of the readout pulse $\phi_2$ between the gate electrode 92 and the source electrode 82 of the MOS field-effect transistor 74, may have spurious signals near the logic level of the "1" bit coupled to the data node 72, even when a "0" data bit is stored in the memory capacitor 62. This possible spurious signal coupling to the data node 72 is avoided in the regenerative amplifier circuit 96 shown in FIG. 12. In this circuit the solid state switch 20, the field-effect transistors 58, 74 and 84 are interconnected in the same manner as in the circuit 94 shown in FIG. 11, except that an additional MOS field-effect transistor 98 is provided to couple readout pulses $\phi_2$ to the gate electrode 92 of the field-effect transistor 74, and the gate of this transistor is connected to terminal 40 of the switch 20. Specifically, the terminal 38 of the solid state swtich 20 and the drain electrode 64 of the field-effect transistor 58, connected to a source of readout pulses $\phi_2$ (not shown), are coupled to the source electrode 100 of the field-effect transistor 98, while the drain electrode 102 thereof is coupled to the gate electrode 92 of the field-effect transistor 74, and the gate electrode 104 of the field-effect transistor 98 is coupled directly to the terminal 40 of the solid state switch 20. With this arrangement, it is impossible to couple a readout pulse $\phi_2$ to the data node 72 when a "0" bit is stored in the memory capacitor 62.

Figure 13:
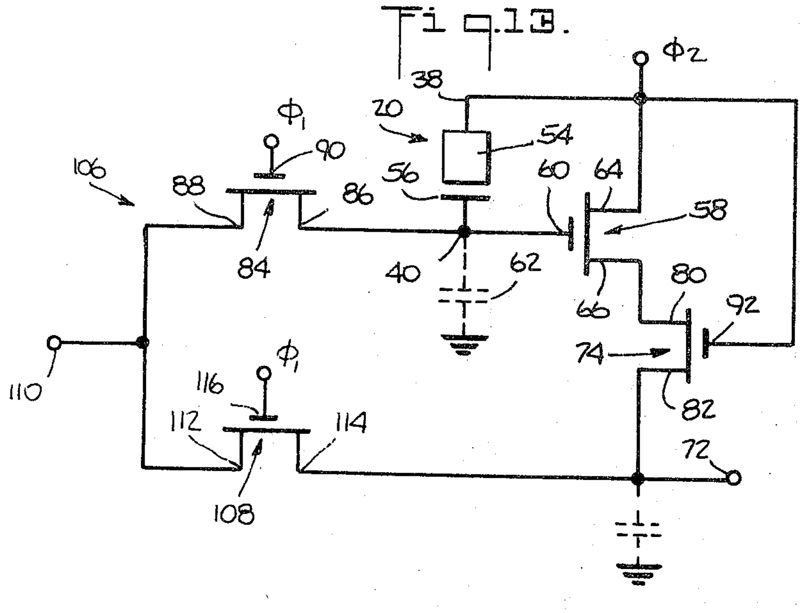
FIG. 13 is a schematic circuit diagram of a digital isolation amplifier embodying the solid state switch of FIG. 1.

The regenerative amplifier shown in FIG. 11 may be extended to provide the digital isolation amplifier circuit 106 shown in FIG. 13. In the isolation circuit 106, a third switch comprising an MOS field-effect transistor 108 is provided for selectively isolating an input data node 110 from the output data node 72. Specifically, the drain electrode 112 of the transistor 108 is connected to the input data node 110 and the source electrode 114 thereof is connected to the output data node 72, while the gate electrode 116 thereof is connected to the source of write pulses $\phi_1$.

In the operation of the isolation amplifier 106 shown in FIG. 13, a data bit to be amplified is applied at the input data node 110 while write pulses $\phi_1$ are applied to both of the gate electrodes 90 and 116 of the MOS field-effect transistors 84 and 108, respectively, to turn on both of these transistors. The turning on of the MOS field-effect transistor 84 couples the input data node 110 directly to the memory storage capacitor 62 to store the input data bit, and the turning on of the MOS field-effect transistor 108 directly couples the input data node 110 to the output data node 72 to provide signal coupling thereto, if desired. The stored data bits are read out by applying a readout pulse $\phi_2$ to the solid state switch 20, the gate electrode 92 of the field-effect transistor 74 and the drain electrode 64 of the field-effect transistor 58. If a "0" data bit is stored in the memory capacitor 62, the solid state switch 20 blocks the coupling of the readout pulse $\phi_2$ through the MOS field-effect transistor 58 to the data node 72, whereas if a "1" data bit is stored in the memory capacitor 62, inversion occurs in the solid state switch 20 and the readout pulse $\phi_2$ is coupled through the solid state switch 20 and the field-effect transistors 58 and 74 to the output data node 72. During the reading out of the stored data, the MOS field-effect transistors 84 and 108 are turned off to isolate the output data node 72 from the input data node 110.

Thus, it will be appreciated from the foregoing, that there is provided in accordance with the present invention, a novel semiconductor element which can be used together with one or more MOS field-effect transistors to form new building blocks for making complex MOS arrays and which can be formed on the same substrate adjacent the MOS field-effect transistors without additional processing steps.

What is claimed is:

1. A memory circuit comprising a data translating circuit having input and output circuits, a solid state switch comprising a semiconductive wafer including a substrate of one conductivity type and a surface channel of opposite conductivity type defined in a major surface of the substrate, a first terminal defining a low resistance contact to said surface channel, and an insulated electrode, including a dielectric layer and an outer electrode covering, overlying a portion of said major surface of the substrate, a second terminal defining a low resistance contact to said outer electrode covering of the insulated electrode, said insulated electrode and said surface channel having overlapping areas characterized in that substantially zero capacitance is defined between said first and second terminals when said second terminal is at a voltage below a predetermined threshold voltage relative to said surface channel and a coupling capacitance is defined between said first and second terminals when said second terminal is at or above said threshold voltage, means for connecting said second terminal to the input circuit of said data translating circuit, memory means coupled between said second terminal and a point of reference in said circuit, data input means coupled to said second terminal for supplying data signals for storage in said memory means, some of the stored data signals having a value equal to or greater than said threshold voltage, readout pulse source means, and means for connecting said first terminal to said readout pulse source means.

2. A memory circuit as in claim 1, further comprising means connecting said output circuit of said data translating circuit to a data output terminal in said circuit.

3. A memory circuit as in claim 2, wherein said output circuit means comprises a first selectively actuable switch means coupling said output circuit to said data output terminal and further comprising means for selectively actuating said switch means in response to said readout pulse source means.

4. A memory circuit as in claim 3, wherein said data translating circuit includes a first MOS field-effect transistor having a gate electrode, a source electrode and a drain electrode and wherein said input circuit of said data translating circuit includes means for connecting said gate electrode to said second terminal, and said output circuit of said data translating circuit includes means for connecting said source electrode to said actuable switch means, and means connecting said drain electrode to a power source.

5. A memory circuit as in claim 4, wherein said drain electrode of said first MOS field-effect transistors is coupled to said readout pulse source means.

6. A memory circuit as in claim 4, wherein said actuable switch means includes a second MOS field-effect transistor having a gate electrode, a source electrode and a drain electrode, one of said source and drain electrodes of the second MOS field-effect transistor being connected to said source electrode of said first MOS field-effect transistor and the other being connected to said data output erminal, and said gate electrode of the second MOS field-effect transistor being connected to said readout pulse source means.

7. A memory circuit as in claim 1, wherein said memory means is coupled to said data input means by a second selectively actuable switch means connected between said memory means with said data output terminal, further including a write pulse source means coupled to said second switch means for controlling the switching state thereof.

8. A memory circuit as in claim 7, wherein said second switch means includes a third MOS field-effect transistor having a gate electrode, a source electrode and a drain electrode, one of said source and drain electrodes of said third field effect transistor being connected to said memory means and the other being connected to said data output terminal, and said gate electrode of said third MOS field-effect transistor being connected to said write pulse source means.

9. A memory circuit as in claim 1, wherein said memory means is coupled to said data input means by a second selectively actuable switch means, further including a write pulse source means, and means for selectively controlling said second switch means in response to said write pulse source.

10. A memory circuit as in claim 9, wherein said second switch means includes a third MOS field-effect transistor having a gate electrode, a source electrode and a drain electrode, one of said source and drain electrode of the third MOS field-effect transistor being connected to said memory means, and said gate electrodes of said third MOS field effect transistor being connected to said write pulse source.

11. A memory circuit means as in claim 9 further comprising a third selectively actuable switch means connecting said input means to said data output terminal, and means for selectively actuating said third switch means in response to said write pulse source.

12. A memory circuit as in claim 11, wherein said third switch means includes a fourth MOS field-effect transistor having a gate electrode, a source electrode and a drain electrode, one of said source and drain electrodes of said fourth MOS field effect transistor being connected to said input means and the other being connected to said data output terminal, and the gate electrode of said fourth MOS field effect transistor being connected to said write pulse source.

* * * * *